US012763686B2

(12) United States Patent
Yang et al.

(10) Patent No.: US 12,763,686 B2
(45) Date of Patent: Oct. 13, 2026

(54) DUTY CYCLE CONTROL CIRCUIT APPLICABLE TO DC-DC BUCK CONVERSION

(71) Applicant: REALTEK SEMICONDUCTOR CORPORATION, Hsinchu (TW)

(72) Inventors: Wen-Hau Yang, Hsinchu (TW); Yen-Ting Lin, Hsinchu (TW); Chun-Yu Luo, Hsinchu (TW); Wei-Wen Ou, Hsinchu (TW); Hung-Hsuan Cheng, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 241 days.

(21) Appl. No.: 18/601,385

(22) Filed: Mar. 11, 2024

(65) Prior Publication Data

US 2024/0313625 A1 Sep. 19, 2024

(30) Foreign Application Priority Data

Mar. 17, 2023 (TW) ................................ 112110135

(51) Int. Cl.
*H02M 3/158* (2006.01)
*H02M 1/00* (2007.01)
(Continued)

(52) U.S. Cl.
CPC ......... *H02M 3/158* (2013.01); *H02M 1/0025* (2021.05); *H02M 1/08* (2013.01); *H03K 19/20* (2013.01)

(58) Field of Classification Search
CPC ....... H02M 1/0025; H02M 1/08; H02M 3/158
See application file for complete search history.

(56) References Cited

U.S. PATENT DOCUMENTS 4,245,351 A * 1/1981 Tults ..................... H03J 5/0272 455/192.3
6,246,222 B1 * 6/2001 Nilles ................. H02M 3/1584 323/283
(Continued)

FOREIGN PATENT DOCUMENTS

CN 1822479 A 8/2006

OTHER PUBLICATIONS

1) OA letter of a counterpart TW application (appl. No. 112110135) mailed on Nov. 8, 2023. 2) Summary of the TW OA letter issued according to the TW counterpart application: (1) Claims 1, 3, and 8~9 are rejected as being anticipated by the cited reference 1 (U.S. Pat. No. 10,554,124 B1). (2) Claim 5 is rejected as being unpatentable overthe cited reference 1 in view ofthe cited reference 2 (CN 1822479 A).

*Primary Examiner* — Gustavo A Rosario-Benitez
(74) *Attorney, Agent, or Firm* — WPAT, PC

(57) ABSTRACT

A duty cycle control circuit generates a duty cycle control signal for controlling the duty cycle of a DC-DC buck conversion signal. The duty cycle control circuit includes: a dual ramp generator for generating a first ramp signal and a second ramp signal having the same frequency and different phases; a first comparator for comparing the first ramp signal with a feedback signal to generate a first control signal; a second comparator for comparing the second ramp signal with the feedback signal to generate a second control signal; and a logical circuit for performing a first predetermined logical operation according to the first control signal and a first conduction-control signal to generate a first part of the duty cycle control signal, and performing a second predetermined logical operation according to the second control signal and a second conduction-control signal to generate a second part of the duty cycle control signal.

18 Claims, 10 Drawing Sheets

(51) Int. Cl.
*H02M 1/08* (2006.01)
*H03K 19/20* (2006.01)

(56) References Cited

U.S. PATENT DOCUMENTS

| | | | | |
|---|---|---|---|---|
| 7,453,250 | B2 * | 11/2008 | Qiu | H02M 3/1584 323/288 |
| 10,554,124 | B1 | 2/2020 | Mangudi | |
| 11,482,995 | B1 * | 10/2022 | Svorc | H02M 3/156 |
| 2007/0273340 | A1 * | 11/2007 | Miller | H02M 3/1582 323/224 |
| 2015/0256060 | A1 * | 9/2015 | Faingersh | H02M 1/36 323/267 |
| 2021/0119465 | A1 * | 4/2021 | Choi | H02J 7/00032 |
| 2021/0336542 | A1 * | 10/2021 | Li | H02M 3/1582 |
| 2022/0209670 | A1 * | 6/2022 | Soleno | H02M 3/1582 |
| 2023/0208403 | A1 * | 6/2023 | Jiang | H03K 3/023 327/295 |
| 2023/0344350 | A1 * | 10/2023 | Greco | H02M 1/0016 |
| 2023/0396162 | A1 * | 12/2023 | Liu | H02M 1/0009 |
| 2024/0120841 | A1 * | 4/2024 | Yang | H02M 1/08 |

* cited by examiner

DUTY CYCLE CONTROL CIRCUIT APPLICABLE TO DC-DC BUCK CONVERSION

BACKGROUND OF THE INVENTION

1. Field of the Invention

The present disclosure relates to a duty cycle control circuit, especially to a duty cycle control circuit applicable to DC-DC buck conversion.

2. Description of Related Art

FIG. 1 shows a DC-DC buck converter 100 controlled under a pulse width modulation (PWM) voltage mode. The DC-DC buck converter 100 includes a ramp generator 110, a comparator 120, a DC-DC buck conversion circuit 130, and an error amplifier 140. The ramp generator 110 generates a ramp signal $V_{RAMP}$. The comparator 120 compares the ramp signal $V_{RAMP}$ with an error signal $V_C$ to generate a control signal CTRL. The DC-DC buck conversion circuit 130 generates an output signal $V_{OUT}$ according to the duty cycle of the control signal CTRL and an input voltage $V_{IN}$. The error amplifier 140 compares the output signal $V_{OUT}$ with a reference signal $V_{REF}$ to generate the error signal $V_C$.

FIG. 2 shows how to determine the duty cycle of the control signal CTRL, wherein each horizontal arrowheaded axis in FIG. 2 represents the timeline. As shown in FIG. 2, when the voltage level of the ramp signal $V_{RAMP}$ is lower than the voltage level of the error signal $V_C$, the comparator 120 outputs the control signal CTRL having a high voltage level. When the total duration of the voltage level of the ramp signal $V_{RAMP}$ being higher than the voltage level of the error signal $V_C$ is shorter than an output delay $T_D$ of the comparator 120, the control signal CTRL outputted by the comparator 120 is still at the high voltage level. When the total duration of the voltage level of the ramp signal $V_{RAMP}$ being higher than the voltage level of the error signal $V_C$ is longer than the output delay $T_D$ of the comparator 120, the comparator 120 outputs the control signal CTRL having a low voltage level.

In light of the above, even though the voltage level of the reference signal $V_{REF}$ is reduced to zero and the voltage level of the feedback signal $V_C$ approaches the minimum voltage level of the ramp signal $V_{RAMP}$, the duration of the control signal CTRL being high merely approximates to the output delay $T_D$ of the comparator 120 but will not be shorter than the output delay $T_D$. Accordingly, in a low-output-voltage application (i.e., in a circumstance that the voltage level of the output signal $V_{OUT}$ is very low), the circuit configuration of FIG. 1 cannot generate the control signal CTRL having a low duty cycle, which causes the ripple of the output signal $V_{OUT}$ to become violent and affects the spectrum of the output signal $V_{OUT}$.

SUMMARY OF THE INVENTION

An object of the present disclosure is to provide a duty cycle control circuit applicable to DC-DC buck conversion and capable of realizing an extremely low duty cycle.

An embodiment of the duty cycle control circuit of the present disclosure can generate a duty cycle control signal to control a duty cycle of an output signal. The embodiment includes a dual ramp generator, a first comparator, a second comparator, and a logical circuit. The dual ramp generator is configured to generate a first ramp signal and a second ramp signal, wherein the first ramp signal and the second ramp signal have the same frequency but different phases. The first comparator is configured to compare the first ramp signal with a feedback signal to generate a first control signal. The second comparator is configured to compare the second ramp signal with the feedback signal to generate a second control signal. The logical circuit is configured to perform a first predetermined logical operation according to a first signal and a first conduction-control signal and thereby generate a first duty cycle control signal as a first part of the duty cycle control signal, and the logical circuit is further configured to perform a second predetermined logical operation according to a second signal and a second conduction-control signal and thereby generate a second duty cycle control signal as a second part of the duty cycle control signal. The first signal is the first control signal or the inversion of the first control signal, and the second signal is the second control signal or the inversion of the second control signal. When the voltage level of the second ramp signal reaches the minimum voltage level of the second ramp signal, the voltage level of the first conduction-control signal changes from low to high and then is kept at a first high voltage level till the voltage level of the first ramp signal reaches the maximum voltage level of the first ramp signal; and when the voltage level of the first ramp signal reaches the minimum voltage level of the first ramp signal, the voltage level of the second conduction-control signal changes from low to high and then is kept at a second high voltage level till the voltage level of the second ramp signal reaches the maximum voltage level of the second ramp signal.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The present specification discloses a duty cycle control circuit applicable to DC-DC buck conversion, wherein the term “DC” denotes “direct current”. The duty cycle control circuit of the present disclosure can realize an extremely low duty cycle.

Figure 1:
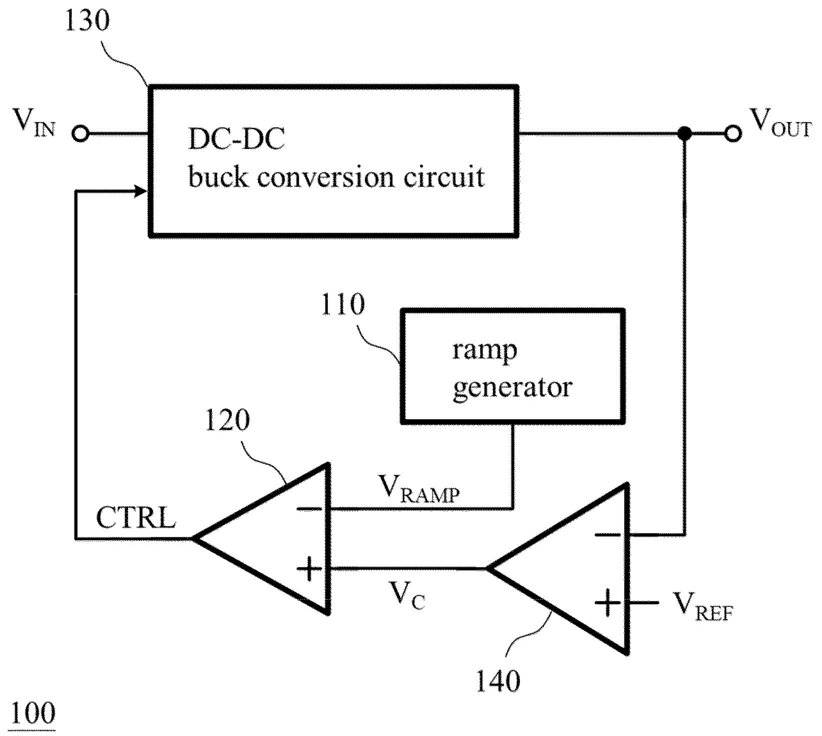
Fig. 1 (Prior Art)
FIG. 1 shows a conventional DC-DC buck converter.
Figure 2:
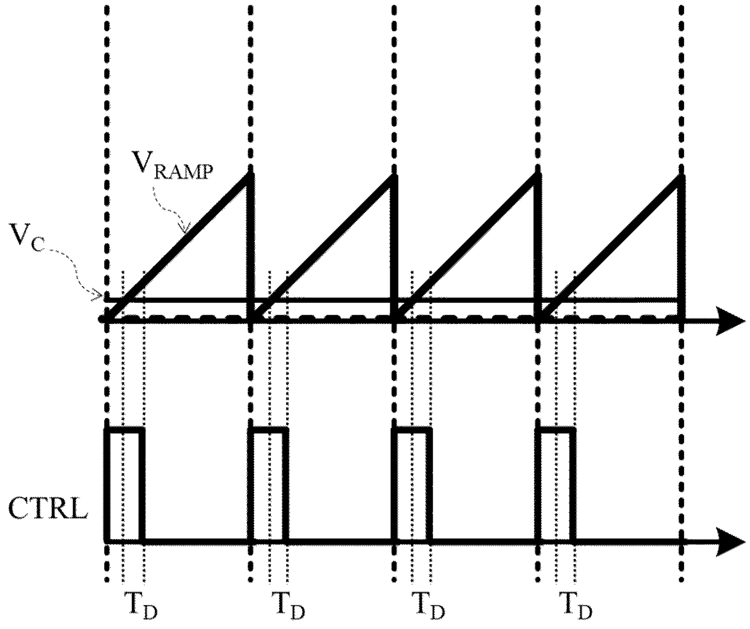
Fig. 2 (Prior Art)
FIG. 2 shows how to determine the duty cycle of the control signal of FIG. 1.
Figure 3:
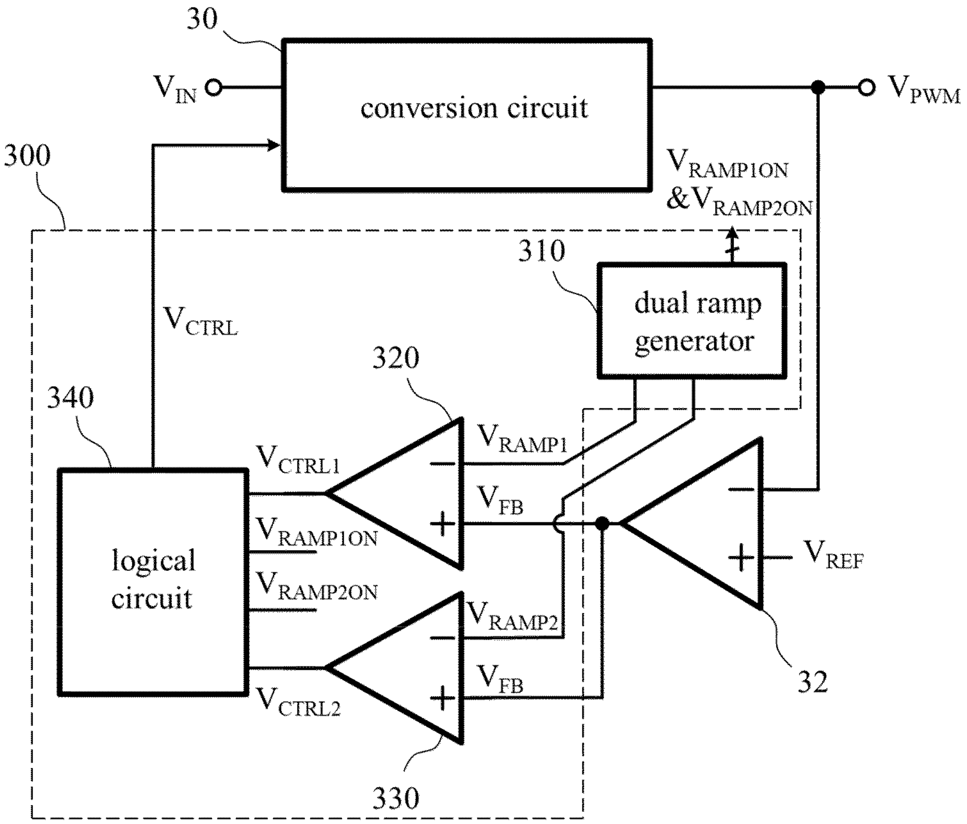
FIG. 3 shows an embodiment of the duty cycle control circuit of the present disclosure.

FIG. 3 shows an embodiment of the duty cycle control circuit of the present disclosure. The duty cycle control circuit 300 of FIG. 3 can generate a duty cycle control signal $V_{CTRL}$ to control a duty cycle of an output signal $V_{PWM}$ of a conversion circuit 30, wherein the conversion circuit 30 may be a known/self-developed circuit (e.g., the DC-DC buck conversion circuit 130 of FIG. 1) which falls beyond the scope of the present disclosure and can be modified according to implementation needs. The duty cycle control circuit 300 includes a dual ramp generator 310, a first comparator 320, a second comparator 330, and a logical circuit 340. These circuits are described in detail in the following paragraphs.

Figure 7:
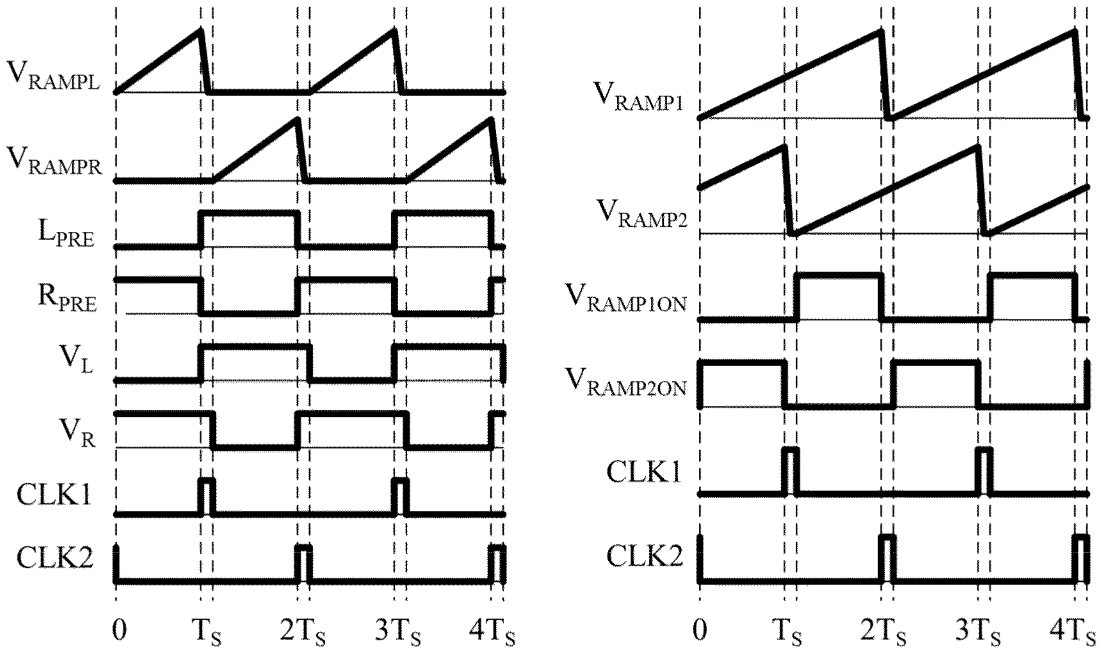
FIG. 7 shows the timing diagram of the waveforms of the main signals of FIGS. 3-5.
Figure 8:
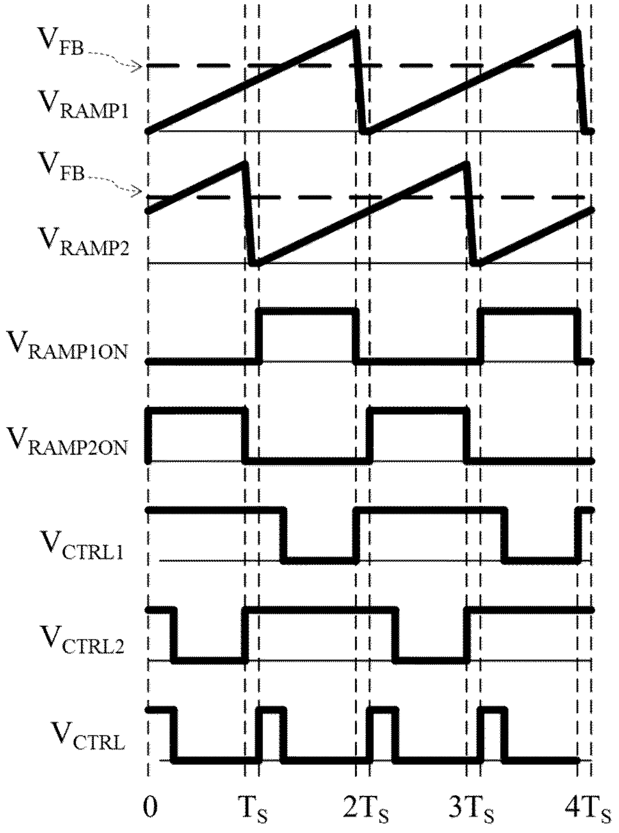
FIG. 8 shows the timing diagram of the waveforms of the main signals of FIG. 3.

Referring to FIG. 3, the dual ramp generator 310 is configured to generate a first ramp signal $V_{RAMP1}$ and a second ramp signal $V_{RAMP2}$, wherein the two ramp signals $V_{RAMP1}$, $V_{RAMP2}$ have the same frequency but different phases (as shown in FIGS. 7-8). In an exemplary implementation, the phase difference between the first ramp signal $V_{RAMP1}$ and the second ramp signal $V_{RAMP2}$ is 180 degrees. When both the first ramp signal $V_{RAMP1}$ and the second ramp signal $V_{RAMP2}$ have the same voltage level, this voltage level is greater than zero; for example, the voltage level is equal to a half of the maximum voltage level of any of the first ramp signal $V_{RAMP1}$ and the second ramp signal $V_{RAMP2}$. The features of the above-mentioned exemplary implementation can vary with implementation needs, if practicable.

Figure 4:
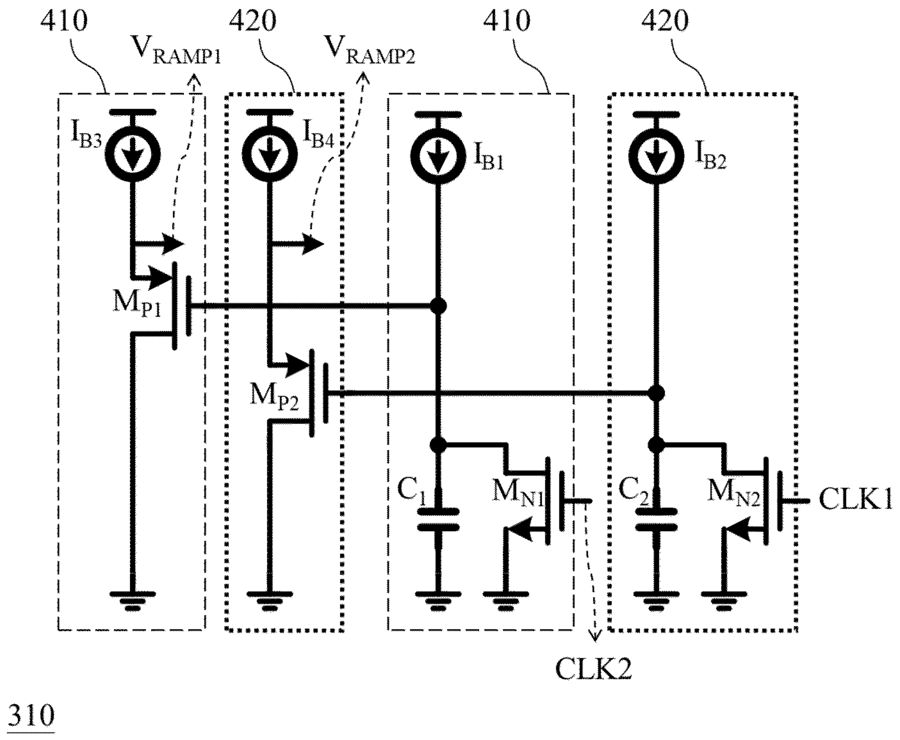
FIG. 4 shows an embodiment of the dual ramp generator of FIG. 3.

FIG. 4 shows an embodiment of the dual ramp generator 310. The embodiment of FIG. 4 includes a first ramp signal generating circuit 410 (i.e., the circuits in the dashed boxes in FIG. 4) and a second ramp signal generating circuit 420 (i.e., the circuits in the dotted boxes in FIG. 4). The first ramp signal generating circuit 410 is configured to perform a first charging or discharging (hereinafter referred to as "charging-discharging") operation according to a second clock signal CLK2 and thereby generate the first ramp signal $V_{RAMP1}$. The second ramp signal generating circuit 420 is configured to perform a second charging-discharging operation according to a first clock signal CLK1 and thereby generate the second ramp signal $V_{RAMP2}$. In an exemplary implementation, the phase difference between the first clock signal CLK1 and the second clock signal CLK2 is 180 degrees. The duration of the first clock signal CLK1 having a high voltage level within a clock period of CLK1 is equal to the time for the second ramp signal $V_{RAMP2}$ changing from the maximum voltage level of the second ramp signal $V_{RAMP2}$ to the minimum voltage level of the second ramp signal $V_{RAMP2}$ (as shown in FIG. 7). The duration of the second clock signal CLK2 having a high voltage level within a clock period of CLK2 is equal to the time for the first ramp signal $V_{RAMP1}$ changing from the maximum voltage level of the first ramp signal $V_{RAMP1}$ to the minimum voltage level of the first ramp signal $V_{RAMP1}$ (as shown in FIG. 7).

Referring to FIG. 4, the first ramp signal generating circuit 410 includes: a first current source $I_{B1}$; a first capacitor $C_1$; a first NMOS transistor $M_{N1}$ (e.g., an n-type MOSFET) configured to be turned on or turned off according to the second clock signal CLK2 so as to let the first current source Isi charge the first capacitor $C_1$ or discharge the first capacitor $C_1$; a third current source $I_{B3}$; and a first PMOS transistor $M_{P1}$ (e.g., a p-type MOSFET) configured to be turned on or turned off according to the voltage of the first capacitor $C_1$ and thereby determine the first ramp signal $V_{RAMP1}$ at the source of the first PMOS transistor $M_{P1}$ in conjunction with the third current source $I_{B3}$. The second ramp signal generating circuit 420 includes: a second current source $I_{B2}$; a second capacitor $C_2$; a second NMOS transistor $M_{N2}$ configured to be turned on or turned off according to the first clock signal CLK1 so as to let the second current source $I_{B2}$ charge the second capacitor $C_2$ or discharge the second capacitor $C_2$; a fourth current source $I_{B4}$; and a second PMOS transistor $M_{P2}$ configured to be turned on or turned off according to the voltage of the second capacitor $C_2$ and thereby determine the second ramp signal $V_{RAMP2}$ at the source of the second PMOS transistor $M_{P2}$ in conjunction with the fourth current source $I_{B4}$.

Figure 5:
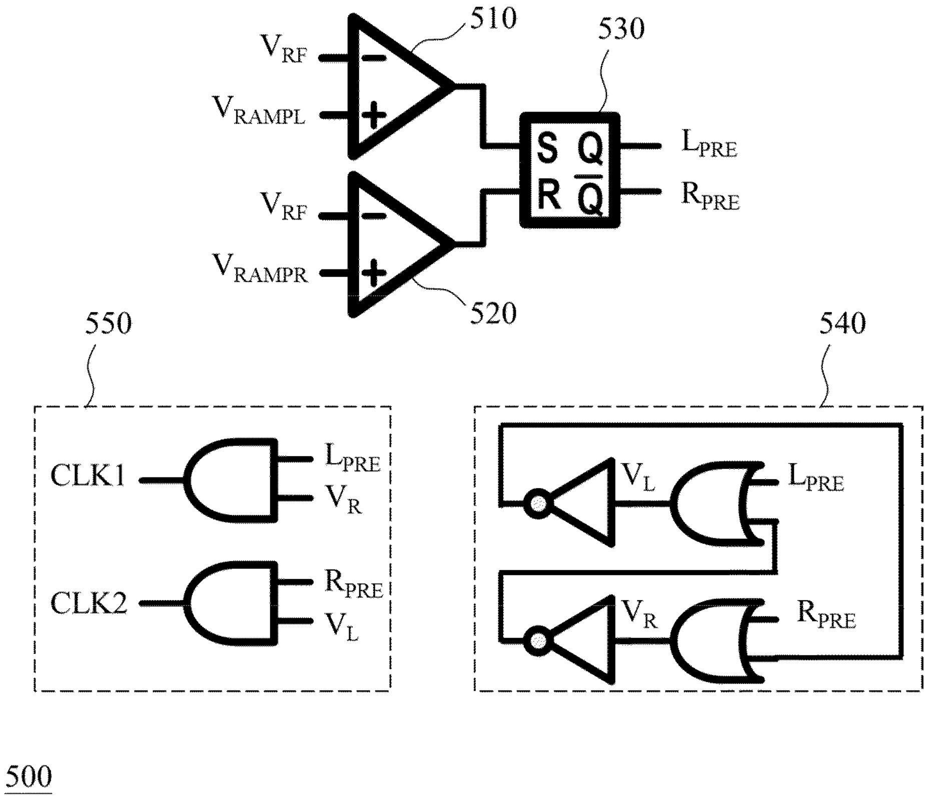
FIG. 5 shows a clock generating circuit for generating the clock signal of FIG. 4.

FIG. 5 shows a clock generating circuit 500 configured to generate the first clock signal CLK1 and the second clock signal CLK2. The clock generating circuit 500 can be included in the dual ramp generator 310 or be set outside the dual ramp generator 310. As shown in FIG. 5, the clock generating circuit 500 includes: a first comparing circuit 510 configured to compare a first half-cycle ramp signal $V_{RAMPL}$ with a reference signal $V_{RF}$ to generate a first comparison result; a second comparing circuit 520 configured to compare a second half-cycle ramp signal $V_{RAMPR}$ with the reference signal $V_{RF}$ to generate a second comparison result; an SR latch 530 configured to generate a first initial pulse signal $L_{PRE}$ according to the first comparison result and generate a second initial pulse signal $R_{PRE}$ according to the second comparison result, wherein the first initial pulse signal $L_{PRE}$ is equal to the inversion of the second initial pulse signal $R_{PRE}$; a delay adjusting circuit 540 including an OR gate and an inverter, wherein the delay adjusting circuit 540 is configured to delay a high-to-low voltage level transition of the first initial pulse signal $L_{PRE}$ according to predetermined delay setting to generate a first pulse signal $V_L$ and further configured to delay a high-to-low voltage level transition of the second initial pulse signal $R_{PRE}$ according to the predetermined delay setting to generate a second pulse signal $V_R$, wherein the OR gate and the inverter of the delay adjusting circuit 540 are common in this technical field and their details are omitted here; and an AND-gate circuit 550 configured to generate the first clock signal CLK1 according to the first initial pulse signal $L_{PRE}$ and the second pulse signal $V_R$, and configured to generate the second clock signal CLK2 according to the second initial pulse signal $R_{PRE}$ and the first pulse signal $V_L$.

Figure 6:
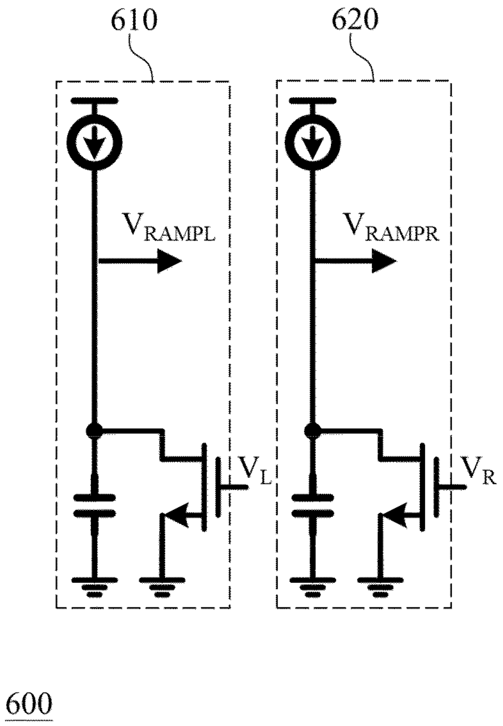
FIG. 6 shows a half-cycle ramp signal generating circuit for generating the half-cycle ramp signal of FIG. 5.

FIG. 6 shows a half-cycle ramp signal generating circuit 600. The half-cycle ramp signal generating circuit 600 is configured to generate the first half-cycle ramp signal $V_{RAMPL}$ and the second half-cycle ramp signal $V_{RAMPR}$, and can be included in the clock generating circuit 500 or be set outside the clock generating circuit 500. As shown in FIG. 6, the half-cycle ramp signal generating circuit 600 includes: a first charging-discharging circuit 610 configured to perform a charging-discharging operation according to the first pulse signal $V_L$ to generate the first half-cycle ramp signal $V_{RAMPL}$; and a second charging-discharging circuit 620 configured to perform a charging-discharging operation according to the second pulse signal $V_R$ to generate the second half-cycle ramp signal $V_{RAMPR}$. Each of the current sources, the capacitors, and the NMOS transistors in FIG. 6 alone is common in this technical field and its detail is omitted here.

FIG. 7 shows the timing diagram of the waveforms of the aforementioned signals $V_{RAMPL}$, $V_{RAMPR}$, $L_{PRE}$, $R_{PRE}$, $V_L$, $V_R$, CLK1, CLK2, $V_{RAMP1}$, and $V_{RAMP2}$, and also shows the timing diagram of the waveforms of the below-mentioned first conduction-control signal $V_{RAMP1ON}$ and second conduction-control signal $V_{RAMP2ON}$, wherein each horizontal axis in FIG. 7 represents the timeline. Those having ordinary skill in the art can appreciate the relations between the above-mentioned signals according to FIG. 7.

Referring to FIG. 3, the first comparator 320 is configured to compare the first ramp signal $V_{RAMP1}$ with a feedback signal $V_{FB}$ of an error amplifier 32 and thereby generate a first control signal $V_{CTRL1}$. The error amplifier 32 is a known/self-developed circuit used for generating the feedback signal $V_{FB}$ according to the output signal $V_{PWM}$ and a reference signal $V_{REF}$, wherein the voltage level (or the gain of the error amplifier 32) of the feedback signal $V_{FB}$ can be determined according to implementation needs. The second comparator 330 is configured to compare the second ramp signal $V_{RAMP2}$ with the feedback signal $V_{FB}$ and thereby generate a second control signal $V_{CTRL2}$.

Referring to FIG. 3, the logical circuit 340 is configured to perform a first predetermined logical operation according to a first signal and a first conduction-control signal $V_{RAMP1ON}$ and thereby generate a first duty cycle control signal as a first part of the duty cycle control signal $V_{CTRL}$ (i.e., the duty cycle control signal $V_{CTRL}$ at the time points 0, 2 $T_S$, 4 $T_S$, and so on in FIG. 8), and further configured to perform a second predetermined logical operation according to a second signal and a second conduction-control signal $V_{RAMP2ON}$ and thereby generate a second duty cycle control signal as a second part of the duty cycle control signal $V_{CTRL}$ (i.e., the duty cycle control signal $V_{CTRL}$ at the time points $T_S$, 3 $T_S$, and so on in FIG. 8). The first signal is the first control signal $V_{CTRL1}$ or the inversion of the first control signal $V_{CTRL1}$, and the second signal is the second control signal $V_{CTRL2}$ or the inversion of the second control signal $V_{CTRL2}$. The first conduction-control signal $V_{RAMP1ON}$ is the inversion of the aforementioned second pulse signal $V_R$, and the second conduction-control signal $V_{RAMP2ON}$ is the inversion of the aforementioned first pulse signal $V_L$.

FIG. 8 shows the timing diagram of the waveforms of the aforementioned signals $V_{RAMP1}$, $V_{RAMP2}$, $V_{RAMP1ON}$, $V_{RAMP2ON}$, $V_{CTRL1}$, $V_{CTRL2}$, and $V_{CTRL}$, wherein each horizontal axis in FIG. 8 represents the timeline. As shown in FIG. 8, when the voltage level of the second ramp signal $V_{RAMP2}$ reaches the minimum voltage level of the second ramp signal $V_{RAMP2}$, the voltage level of the first conduction-control signal $V_{RAMP1ON}$ changes from low to high and then is kept at a first high voltage level till the voltage level of the first ramp signal $V_{RAMP1}$ reaches the maximum voltage level of the first ramp signal $V_{RAMP1}$; and when the voltage level of the first ramp signal $V_{RAMP1}$ reaches the minimum voltage level of the first ramp signal $V_{RAMP1}$, the voltage level of the second conduction-control signal $V_{RAMP2ON}$ changes from low to high and then is kept at a second high voltage level till the voltage level of the second ramp signal $V_{RAMP2}$ reaches the maximum voltage level of the second ramp signal $V_{RAMP2}$.

Figure 9:
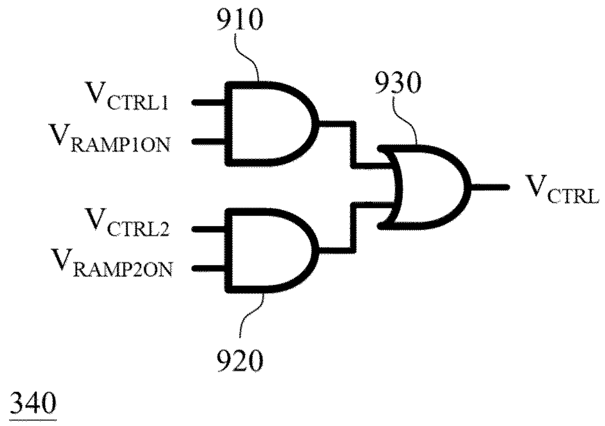
FIG. 9 shows an embodiment of the logical circuit of FIG. 3.

FIG. 9 shows an embodiment of the logical circuit 340. This embodiment is suitable for a circumstance that the conversion circuit 30 of FIG. 3 operates in an active-high mode, which means that the duty cycle of the duty cycle control signal $V_{CTRL}$ is proportional to the duty cycle of the output signal $V_{PWM}$. In the embodiment of FIG. 9: the aforementioned first signal is the first control signal $V_{CTRL1}$, the aforementioned second signal is the second control signal $V_{CTRL2}$; and each of the first predetermined logical operation and the second predetermined logical operation is a logical conjunction operation. When the voltage level of the first ramp signal $V_{RAMP1}$ is lower than the voltage level of the feedback signal $V_F$B, the voltage level of the first control signal $V_{CTRL1}$ is high (as shown in FIG. 8); and when the voltage level of the first ramp signal $V_{RAMP1}$ is higher than the voltage level of the feedback signal $V_F$B, the voltage level of the first control signal $V_{CTRL1}$ is low (as shown in FIG. 8). When the voltage level of the second ramp signal $V_{RAMP2}$ is lower than the voltage level of the feedback signal $V_{FB}$, the voltage level of the second control signal $V_{CTRL2}$ is high (as shown in FIG. 8); and when the voltage level of the second ramp signal $V_{RAMP2}$ is higher than the voltage level of the feedback signal $V_F$B, the voltage level of the second control signal $V_{CTRL2}$ is low (as shown in FIG. 8).

Referring to FIG. 9, the logical circuit 340 includes: a first AND gate 910 configured to generate a first logical signal according to the first control signal $V_{CTRL1}$ and the first conduction-control signal $V_{RAMP1ON}$; a second AND gate 920 configured to generate a second logical signal according the second control signal $V_{CTRL2}$ and the second conduction-control signal $V_{RAMP2ON}$; and an OR gate 930 configured to generate the duty cycle control signal $V_{CTRL}$ according to the first logical signal and the second logical signal.

Figure 10:
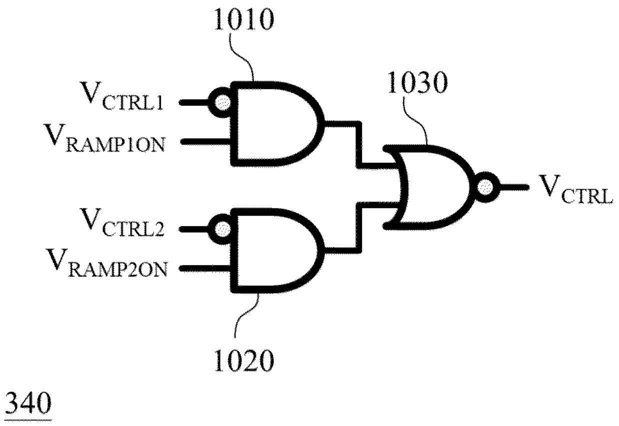
FIG. 10 shows another embodiment of the logical circuit of FIG. 3.

FIG. 10 shows another embodiment of the logical circuit 340. This embodiment is suitable for a circumstance that the conversion circuit 30 of FIG. 3 operates in an active-low mode, which means that the duty cycle of the duty cycle control signal $V_{CTRL}$ is inversely proportional to the duty cycle of the output signal $V_{PWM}$. In the embodiment of FIG. 10: the first signal is the inversion of the first control signal $V_{CTRL1}$, and the second signal is the inversion of the second control signal $V_{CTRL2}$; and each of the first predetermined logical operation and the second predetermined logical operation includes a logical conjunction operation and an inverse operation. It is noted that when the logical circuit 340 of FIG. 10 is applied in the duty cycle control circuit 300 of FIG. 3, the positive input terminal (i.e., the terminal with the symbol "+" in the comparator 320/330 of FIG. 3) and the negative input terminal (i.e., terminal with the symbol "−" in the comparator 320/330 of FIG. 3) should be exchanged. Accordingly, when the voltage level of the first ramp signal $V_{RAMP1}$ is lower (or alternatively higher) than the voltage level of the feedback signal $V_F$B, the voltage level of the first control signal $V_{CTRL1}$ is low (or alternatively high). When the voltage level of the second ramp signal $V_{RAMP2}$ is lower (or alternatively higher) than the voltage level of the feedback signal $V_F$B, the voltage level of the second control signal $V_{CTRL2}$ is low (or alternatively high).

Referring to FIG. 10, the logical circuit 340 includes: a first AND gate 1010 configured to generate a first logical signal according to the inversion of the first control signal $V_{CTRL1}$ and the first conduction-control signal $V_{RAMP1ON}$; a second AND gate 1020 configured to generate a second logical signal according the inversion of the second control signal $V_{CTRL2}$ and the second conduction-control signal $V_{RAMP2}$ON; and a NOR gate 1030 configured to generate the duty cycle control signal $V_{CTRL}$ according to the first logical signal and the second logical signal. In FIG. 10, the circular symbol "○" denotes an inversion operation, and this symbol is usually used in this technical field.

It is noted that based on the design of the duty cycle control circuit 300 of the present disclosure, when at least one of the first comparator 320 and the second comparator 330 has an output delay due to its comparison operation, in the aforementioned active-high mode the duration of the voltage level of the duty cycle control signal $V_{CTRL}$ being high can be shorter than the output delay, and in the aforementioned active-low mode the duration of the voltage level of the duty cycle control signal $V_{CTRL}$ being low can be shorter than the output delay. In brief, the duty cycle control circuit 300 of the present disclosure can realize an extremely low duty cycle of the output signal $V_{PWM}$.

It is noted that people having ordinary skill in the art can selectively use some or all of the features of any embodiment in this specification or selectively use some or all of the features of multiple embodiments in this specification to implement the present invention as long as such implementation is practicable; in other words, the way to implement the present invention is flexible based on the present disclosure.

To sum up, in a low-output-voltage application (i.e., in a circumstance that the output signal $V_{PWM}$ has a very low voltage level) the duty cycle control circuit of the present disclosure still can realize an extremely low duty cycle of the output signal $V_{PWM}$.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A duty cycle control circuit applicable to DC-DC buck conversion, the duty cycle control circuit being capable of generating a duty cycle control signal to control a duty cycle of an output signal and comprising:

a dual ramp generator configured to generate a first ramp signal and a second ramp signal, wherein the first ramp signal and the second ramp signal have a same frequency but different phases;

a first comparator configured to compare the first ramp signal with a feedback signal to generate a first control signal;

a second comparator configured to compare the second ramp signal with the feedback signal to generate a second control signal; and a logical circuit configured to perform a first predetermined logical operation according to a first signal and a first conduction-control signal and thereby generate a first duty cycle control signal as a first part of the duty cycle control signal, and further configured to perform a second predetermined logical operation according to a second signal and a second conduction-control signal and thereby generate a second duty cycle control signal as a second part of the duty cycle control signal, wherein the first signal is the first control signal or an inversion of the first control signal, and the second signal is the second control signal or an inversion of the second control signal, wherein when the first signal is the inversion of the first control signal and the second signal is the inversion of the second control signal; when a voltage level of the first ramp signal is lower than a voltage level of the feedback signal, a voltage level of the first control signal is low; when the voltage level of the first ramp signal is higher than the voltage level of the feedback signal, the voltage level of the first control signal is high; when a voltage level of the second ramp signal is lower than the voltage level of the feedback signal, a voltage level of the second control signal is low; and when the voltage level of the second ramp signal is higher than the voltage level of the feedback signal, the voltage level of the second control signal is high.

2. The duty cycle control circuit of claim 1, wherein when the voltage level of the second ramp signal reaches a minimum voltage level of the second ramp signal, a voltage level of the first conduction-control signal changes from low to high and then is kept at a first high voltage level until the voltage level of the first ramp signal reaches a maximum voltage level of the first ramp signal; and when the voltage level of the first ramp signal reaches a minimum voltage level of the first ramp signal, a voltage level of the second conduction-control signal changes from low to high and then is kept at a second high voltage level until the voltage level of the second ramp signal reaches a maximum voltage level of the second ramp signal.

3. The duty cycle control circuit of claim 1, wherein when the first signal is the first control signal and the second signal is the second control signal, each of the first predetermined logical operation and the second predetermined logical operation is a logical conjunction operation.

4. The duty cycle control circuit of claim 3, wherein a duty cycle of the duty cycle control signal is proportional to the duty cycle of the output signal.

5. The duty cycle control circuit of claim 4, wherein the logical circuit includes:

a first AND gate configured to generate a first logical signal according to the first control signal and the first conduction-control signal;

a second AND gate configured to generate a second logical signal according to the second control signal and the second conduction-control signal; and an OR gate configured to generate the duty cycle control signal according to the first logical signal and the second logical signal.

6. The duty cycle control circuit of claim 1, wherein when the first signal is the inversion of the first control signal and the second signal is the inversion of the second control signal, each of the first predetermined logical operation and the second predetermined logical operation includes a logical conjunction operation and an inverse operation.

7. The duty cycle control circuit of claim 6, wherein a duty cycle of the duty cycle control signal is inversely proportional to the duty cycle of the output signal.

8. The duty cycle control circuit of claim 7, wherein the logical circuit includes:

a first AND gate configured to generate a first logical signal according to an inversion signal of the first control signal and the first conduction-control signal;

a second AND gate configured to generate a second logical signal according to an inversion signal of the second control signal and the second conduction-control signal; and a NOR gate configured to generate the duty cycle control signal according to the first logical signal and the second logical signal.

9. The duty cycle control circuit of claim 1, wherein when the first signal is the first control signal and the second signal is the second control signal; when the voltage level of the first ramp signal is lower than the voltage level of the feedback signal, the voltage level of the first control signal is high; when the voltage level of the first ramp signal is higher than the voltage level of the feedback signal, the voltage level of the first control signal is low; when the voltage level of the second ramp signal is lower than the voltage level of the feedback signal, the voltage level of the second control signal is high; and when the voltage level of the second ramp signal is higher than the voltage level of the feedback signal, the voltage level of the second control signal is low.

10. The duty cycle control circuit of claim 1, wherein at least one of the first comparator and the second comparator has an output delay due to a comparison operation; when a voltage level of the duty cycle control signal is high and a high-level duration of the duty cycle control signal is proportional to the duty cycle of the output signal, the high-level duration is shorter than the output delay; and when the voltage level of the duty cycle control signal is low and a low-level duration of the duty cycle control signal is proportional to the duty cycle of the output signal, the low-level duration is shorter than the output delay.

11. The duty cycle control circuit of claim 1, wherein a phase difference between the first ramp signal and the second ramp signal is 180 degrees.

12. The duty cycle control circuit of claim 11, wherein when the voltage level of the first ramp signal is equal to the voltage level of the second ramp signal, both the voltage level of the first ramp signal and the voltage level of the second ramp signal are greater than zero.

13. The duty cycle control circuit of claim 1, wherein the dual ramp generator includes:

- a first ramp signal generating circuit configured to perform a first charging-discharging operation according to a second clock signal and thereby generate the first ramp signal; and
- a second ramp signal generating circuit configured to perform a second charging-discharging operation according to a first clock signal and thereby generate the second ramp signal,
- wherein a phase difference between the first clock signal and the second clock signal is 180 degrees.

14. The duty cycle control circuit of claim 13, wherein a duration of the first clock signal having a first high voltage level within a first clock period is equal to a time for the second ramp signal changing from a maximum voltage level of the second ramp signal to a minimum voltage level of the second ramp signal, and a duration of the second clock signal having a second high voltage level within a second clock period is equal to a time for the first ramp signal changing from a maximum voltage level of the first ramp signal to a minimum voltage level of the first ramp signal.

15. The duty cycle control circuit of claim 13, wherein:

- the first ramp signal generating circuit includes:
  - a first current source;
  - a first capacitor;
  - a first NMOS transistor configured to be turned on or turned off according to the second clock signal and thereby allow the first current source to charge or discharge the first capacitor; and
  - a first PMOS transistor configured to be turned on or turned off according to a voltage of the first capacitor and thereby determine the first ramp signal at a source terminal of the first PMOS transistor; and
- the second ramp signal generating circuit includes:
  - a second current source;
  - a second capacitor;
  - a second NMOS transistor configured to be turned on or turned off according to the first clock signal and thereby allow the second current source to charge or discharge the second capacitor; and
  - a second PMOS transistor configured to be turned on or turned off according to a voltage of the second capacitor and thereby determine the second ramp signal at a source terminal of the second PMOS transistor.

16. The duty cycle control circuit of claim 13, wherein the dual ramp generator further includes:

- a clock generating circuit, comprising:
  - a first comparing circuit configured to compare a first half-cycle ramp signal with a reference signal to generate a first comparison result;
  - a second comparing circuit configured to compare a second half-cycle ramp signal with the reference signal to generate a second comparison result;
  - an SR latch configured to generate a first initial pulse signal according to the first comparison result and generate a second initial pulse signal according to the second comparison result, wherein the first initial pulse signal is an inversion signal of the second initial pulse signal;
  - a delay adjusting circuit configured to delay a high-to-low voltage level transition of the first initial pulse signal according to predetermined delay setting to generate a first pulse signal, and further configured to delay a high-to-low voltage level transition of the second initial pulse signal according to the predetermined delay setting to generate a second pulse signal; and
  - an AND-gate circuit configured to generate the first clock signal according to the first initial pulse signal and the second pulse signal, and further configured to generate the second clock signal according to the second initial pulse signal and the first pulse signal.

17. The duty cycle control circuit of claim 16, wherein the clock generating circuit further includes:

- a first charging-discharging circuit configured to perform a third charging-discharging operation according to the first pulse signal to generate the first half-cycle ramp signal; and
- a second charging-discharging circuit configured to perform a fourth charging-discharging operation according to the second pulse signal to generate the second half-cycle ramp signal.

18. The duty cycle control circuit of claim 1, further comprising:

- an error amplifier configured to generate the feedback signal according to the output signal and a reference signal.

* * * * *